US011348802B2

(12) United States Patent
Choi et al.

(10) Patent No.: US 11,348,802 B2
(45) Date of Patent: *May 31, 2022

(54) DRY ETCHING APPARATUS

(71) Applicants: Sang Jun Choi, Seoul (KR); Ji Sung Kang, Gimje-si (KR)

(72) Inventors: Sang Jun Choi, Seoul (KR); Ji Sung Kang, Gimje-si (KR); Kyung Jin Lee, Seoul (KR)

(73) Assignee: VAULT CREATION CO., LTD., Seoul (KR)

( * ) Notice: Subject to any disclaimer, the term of this patent is extended or adjusted under 35 U.S.C. 154(b) by 44 days.

This patent is subject to a terminal disclaimer.

(21) Appl. No.: 16/094,717

(22) PCT Filed: Apr. 17, 2017

(86) PCT No.: PCT/KR2017/004110
§ 371 (c)(1),
(2) Date: Oct. 18, 2018

(87) PCT Pub. No.: WO2017/183872
PCT Pub. Date: Oct. 26, 2017

(65) Prior Publication Data
US 2019/0122893 A1  Apr. 25, 2019

(30) Foreign Application Priority Data

Apr. 18, 2016 (KR) .................. 10-2016-0047031

(51) Int. Cl.
*H01L 21/311* (2006.01)
*H01L 21/3213* (2006.01)
(Continued)

(52) U.S. Cl.
CPC ........ *H01L 21/31116* (2013.01); *H01J 37/00* (2013.01); *H01L 21/3065* (2013.01);
(Continued)

(58) Field of Classification Search
CPC ........ H01L 21/31116; H01L 21/67109; H01L 21/32136; H01L 21/67248;
(Continued)

(56) References Cited

U.S. PATENT DOCUMENTS 4,798,650 A * 1/1989 Nakamura ........ H01L 21/32136
438/673
5,075,256 A * 12/1991 Wang .................. H01L 21/0209
438/716
(Continued)

FOREIGN PATENT DOCUMENTS

JP           3662212       6/2005
KR    10-2009-0106730    10/2009
(Continued)

OTHER PUBLICATIONS

International Search Report for International Application No. PCT/KR2017/004110; dated Aug. 23, 2017.

*Primary Examiner* — Ram N Kackar
*Assistant Examiner* — Laureen Chan
(74) *Attorney, Agent, or Firm* — Kile Park Reed & Houtteman PLLC (57) ABSTRACT

The present invention relates to a dry etching apparatus which can be applied regardless of materials. The dry etching apparatus may include: an anode unit; a cathode unit configured to receive a bidirectional voltage source of which the voltage polarity alternates between a positive voltage and a negative voltage with time, and separated from the anode unit; a positioning unit configured to position a work piece at a surface of the cathode unit, facing the anode unit; and a bidirectional voltage source supply unit configured to apply the bidirectional voltage source to the cathode unit.

14 Claims, 8 Drawing Sheets

(51) Int. Cl.
*H01J 37/00* (2006.01)
*H01L 21/67* (2006.01)
*H01L 21/3065* (2006.01)

(52) U.S. Cl.
CPC .. *H01L 21/32135* (2013.01); *H01L 21/32136* (2013.01); *H01L 21/67069* (2013.01); *H01L 21/67109* (2013.01); *H01L 21/67248* (2013.01)

(58) Field of Classification Search
CPC ......... H01L 21/67069; H01L 21/32135; H01L 21/3065; H01L 21/687; H01L 21/68742; H01L 21/6875; H01J 37/00; H01J 37/32091; H01J 37/32568; H01J 37/32128; H01J 37/32137; H01J 37/32146; H01J 37/32155; H01J 37/32522; H01J 37/32724; H01J 37/32697; H01J 37/32706; H01J 37/32366; H01J 37/32403; H01J 37/32532; H01J 37/32477; H01J 37/32486; H01J 37/32495; H01J 37/32504; H05H 2001/4675
See application file for complete search history.

(56) References Cited

U.S. PATENT DOCUMENTS

| | | | | |
|---|---|---|---|---|
| 5,110,437 A | * | 5/1992 | Yamada | H01J 37/32082 204/298.33 |
| 5,354,413 A | * | 10/1994 | Smesny | H01J 37/32009 156/345.47 |
| 6,245,189 B1 | * | 6/2001 | Rigali | H01J 37/32082 118/723 E |
| 2004/0255863 A1 | * | 12/2004 | Higashiura | H01J 37/32082 118/723 E |
| 2006/0037703 A1 | * | 2/2006 | Koshiishi | H01J 37/3244 156/345.47 |
| 2007/0152691 A1 | * | 7/2007 | Ogasawara | H01L 21/68742 324/756.05 |
| 2011/0049100 A1 | * | 3/2011 | Han | H01J 37/32623 216/67 |
| 2011/0303643 A1 | * | 12/2011 | Wada | H01J 37/32091 216/71 |
| 2011/0318934 A1 | * | 12/2011 | Wada | H01J 37/04 438/714 |
| 2013/0049592 A1 | * | 2/2013 | Yeom | H01J 37/32091 315/111.21 |
| 2013/0136872 A1 | * | 5/2013 | Booth | C23C 16/509 427/569 |
| 2013/0333616 A1 | * | 12/2013 | Klindworth | C23C 16/50 118/719 |
| 2015/0129112 A1 | * | 5/2015 | Saito | H01J 37/3244 156/89.12 |

FOREIGN PATENT DOCUMENTS

| | | |
|---|---|---|
| KR | 10-2010-0004857 | 1/2010 |
| KR | 10-2014-0068090 | 6/2014 |
| KR | 10-2014-0113530 | 9/2014 |

* cited by examiner

DRY ETCHING APPARATUS

TECHNICAL FIELD

The present disclosure relates to a dry etching apparatus, and more particularly, to a dry etching apparatus which can be applied regardless of materials.

BACKGROUND ART

An etching process is applied to process a semiconductor or various materials or products.

Such an etching process refers to a process of partially etching the surface of a work piece. As the etching process, a wet etching method using a chemical method is generally used.

Recently, the etching process is applied to various materials. However, there is a limitation on materials to which the wet etching method can be applied.

Therefore, a dry etching method has been introduced instead of the wet etching method.

Figure 1:
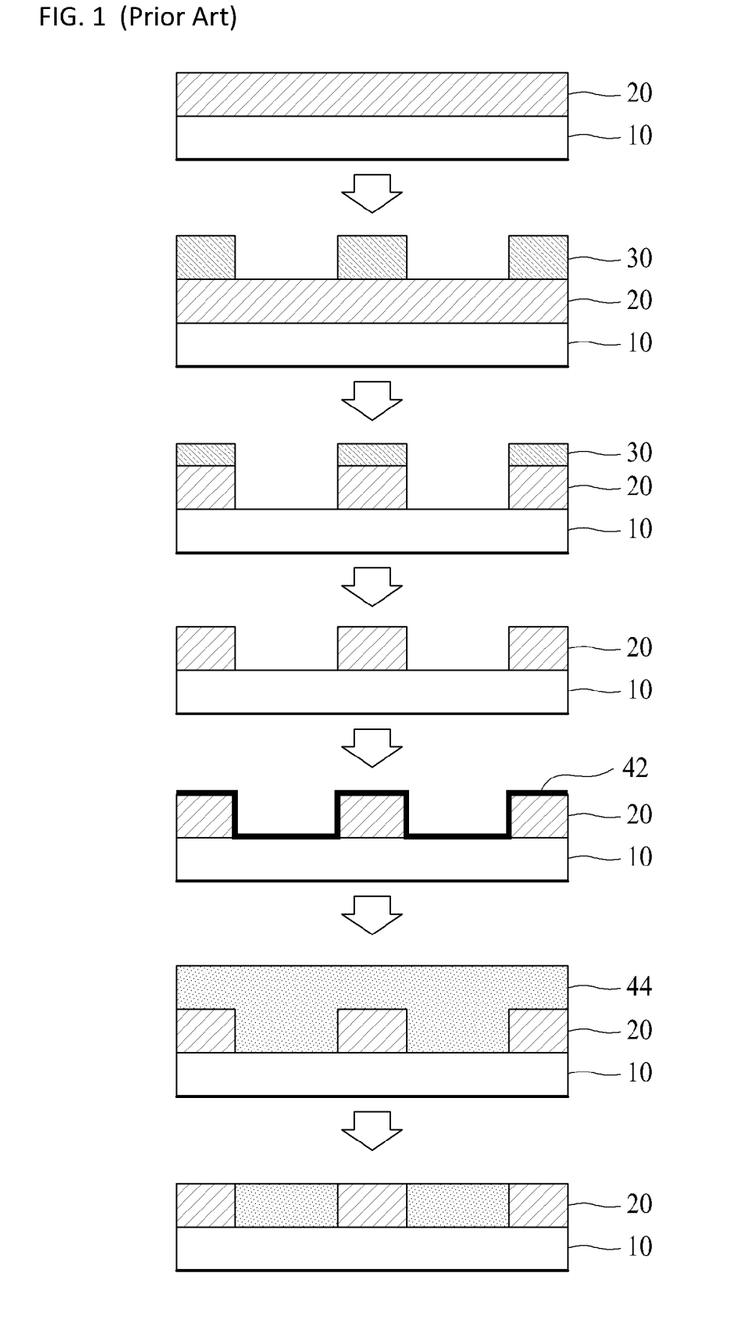
FIG. 1 illustrates a process of etching a Cu layer on a semiconductor using a conventional dry etching method.

FIG. 1 illustrates a process of etching copper (Cu) on a semiconductor using such a dry etching method.

First, a work piece having a hard mask 20 deposited on silicon 10 is subjected to a lithography process, and dry etching is performed on the hard mask 20.

Then, a photoresist (PR) film 30 formed during the lithography process is removed, and a Cu film 42 is then deposited in a vacuum chamber.

Then, Cu 44 is deposited on the deposited Cu film 42 through an electro-plating method. Then, the Cu 44 formed above the hard mask 20 is removed through a chemical-mechanical polishing (CMP) method.

Since the conventional dry etching method includes the chemical process, the number of processes is inevitably increased. Furthermore, since only a few volatile materials can be applied to the dry etching method, various materials cannot be applied to the dry etching method.

DISCLOSURE

Technical Problem

The present invention has been made to solve the problems occurring in the related art, and an object of the present invention is to provide a dry etching apparatus which can be applied to various materials without relying on a chemical process, and a control method thereof.

The objects of the present invention are not limited by the above-described object, and other objects which are not described will be able to be understood by skilled in the art from the following descriptions.

Technical Solution

In an embodiment, a dry etching apparatus may include: an anode unit; a cathode unit configured to receive a bidirectional voltage source of which the voltage polarity alternates between a positive voltage and a negative voltage with time, and spaced apart from the anode unit; a positioning unit configured to position a work piece at a surface of the cathode unit, facing the anode unit; and a bidirectional voltage source supply unit configured to apply the bidirectional voltage source to the cathode unit.

The cathode unit may be installed at the top, and the anode unit may be positioned at the bottom.

In the following descriptions, a direction following the gravity based on the gravity direction may be set to the bottom, and the opposite direction thereof may be set to the top.

The dry etching apparatus may further include a distance adjusting unit configured to adjust the distance between the cathode unit and the anode unit.

The distance adjusting unit may include: a motor configured to provide a rotational force; a coupling rotated by the rotational force of the motor, and having a through-hole formed along the central axis of rotation, the through-hole having a screw thread formed on the inner circumferential surface thereof; and a support rod inserted into the through-hole of the coupling so as to be engaged with the inner circumferential surface of the through-hole, and extended upward to support the cathode unit. While the coupling is rotated by the rotational force of the motor, the support rod and the cathode unit supported by the support rod may be moved upward/downward to adjust the distance between the cathode unit and the anode unit.

The positioning unit may elastically support the work piece to be positioned close to the surface of the cathode unit, facing the anode unit.

The positioning unit may include: a first member inserted into a fixed piece installed at the bottom of the anode unit so as to move in the top-to-bottom direction, and extended upward; a second member formed at the top of the first member, having a larger diameter than the first member, and configured to position the work piece close to the cathode unit; and a spring positioned outside the first member, and configured to elastically support the second member against the fixed piece while the bottom thereof is supported by the fixed piece and the top thereof is supported by the second member.

The dry etching apparatus may further include a DC voltage source application unit configured to apply a DC voltage source to the anode unit in order to decrease an ion hitting time required for the work piece while increasing an electron hitting time required for the work piece.

A negative voltage or positive voltage of the DC voltage may be applied to the anode unit.

A low-frequency AC voltage applied to the cathode unit may have a lower frequency than 1 MHz.

The bidirectional voltage may include a rising section in which the waveform of the voltage disperses negatively or positively and a falling section in which the waveform of the voltage converges to 0.

The DC voltage source applied to the anode unit by the DC voltage source application unit may range from 1% to 200% of the maximum voltage of the bidirectional voltage source applied to the cathode unit by the bidirectional voltage source supply unit.

The distance between the cathode unit and the anode unit, which is adjusted by the distance adjusting unit, may range from 3 mm to 50 mm.

The dry etching apparatus may further include a first anode insulator installed on a surface of the anode unit, facing the cathode unit.

The dry etching apparatus may further include: a base unit formed at the bottom of the anode unit so as to be grounded; a second anode insulator installed between the base unit and the anode unit.

Insulation may be achieved to block a current from being applied to the work piece.

The cathode unit may include: a first conductor disposed at the uppermost portion so as to be grounded; a second conductor disposed at the bottom of the first conductor, and configured to receive the bidirectional voltage source from the bidirectional voltage source supply unit; and a cathode insulator disposed between the first and second conductors and at the circumference of the second conductor.

The cathode insulator may be formed of an oxide insulator such as oxide aluminum ($Al_2O_3$) or a nitride insulator such as aluminum nitride (AlN).

At this time, the insulator positioned close to the work piece may be bonded to the second conductor of the cathode unit to which the bidirectional voltage source is applied, through an integrated coating technique or a bonding technique using a bonding material with an excellent heat transfer characteristic. Therefore, temperature control may be smoothly performed while generated heat is rapidly discharged to a cooling unit. Furthermore, the insulator may include a material with a high dielectric constant to easily perform plasma characteristic control.

The dry etching apparatus may further include a temperature control unit configured to cool down the cathode unit or additionally supply heat such that an etching process change depending on the temperature is minimized during the dry etching process, and the dry etching process is performed within a predetermined temperature range.

The temperature control unit may include: a cooling channel formed in the second conductor, such that cooling water flows therethrough; and a refrigerant circulating unit configured to circulate a refrigerant through the cooling channel.

The temperature control unit may further include a temperature measurement unit configured to measure the temperature of the second conductor.

Advantageous Effects

According to the embodiment of the present invention, the dry etching apparatus can significantly reduce the etching process time than in the conventional dry etching method, thereby improving the productivity. Furthermore, the dry etching apparatus can perform dry etching on various materials and products regardless of materials, and prevent redeposition such that an etched portion can be cleanly formed without redeposition or contamination.

The effects of the present invention are not limited by the above-described effects, and other effects which are not described will be able to be understood by skilled in the art from the following descriptions.

MODE FOR INVENTION

Hereafter, exemplary embodiments which can implement the purpose of the present invention will be described in detail with reference to the accompanying drawings. Throughout the descriptions of the embodiments, like names and reference numerals are used for the same components, and additional descriptions thereof will be omitted.

In order to remove a limitation on materials in comparison to the conventional dry etching method described in the background, the present applicant has noticed that a high-energy ion source needs to hit a work piece harder, different process temperatures need to be applied depending on work pieces, and a process temperature difference needs to be maintained at a small value during a process of processing a work piece, when a process temperature is set. For example, the present applicant has noticed such aspects, in order to avoid hardening of photoresist (PR) which may occur when the temperature of the work piece exceeds 80° C. Furthermore, an etching yield difference caused by a process temperature difference during a process of processing a work piece can be suppressed, and setting control for various process temperature profiles can be performed. For example, the upper limit or lower limit temperature of some work piece materials can be set.

The present applicant has come up with the concept to expand a sheath region of plasma, to use a high voltage and a bidirectional voltage source of 1 MHz or less, and to improve plasma density, such that a high-energy ion source hits a work piece with higher kinetic energy.

Furthermore, in order to smoothly perform temperature control on a work piece, the present applicant has come up with the concept to insulate the work piece such that no current is applied to the work piece and to add a temperature control function to a cathode unit where the work piece is positioned. At this time, an insulator positioned close to the work piece may be bonded to a portion to which a bidirectional voltage source is applied, through an integrated coating technique or a bonding technique using a bonding material with an excellent heat transfer characteristic. Thus, temperature control can be smoothly performed while generated heat is rapidly discharged to a cooling unit.

Figure 2:
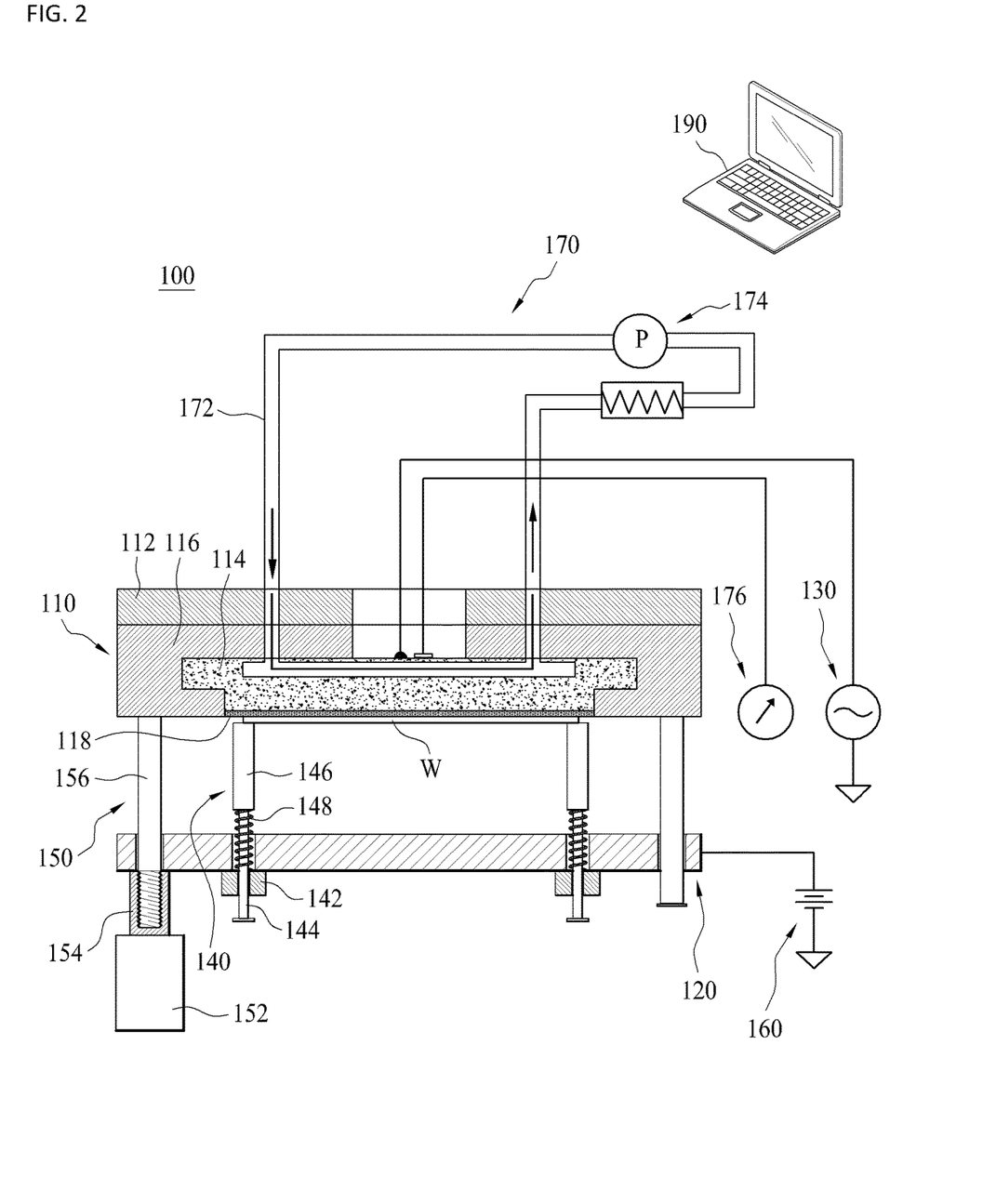
FIG. 2 is a cross-sectional view illustrating a dry etching apparatus according to an embodiment of the present invention.

As illustrated in FIG. 2, a dry etching apparatus 100 according to an embodiment of the present invention may include an anode unit 120, a cathode unit 110, a positioning unit 140 and a bidirectional voltage source supply unit 130.

The anode unit 120 and the cathode unit 110 are arranged in a housing (not illustrated) so as to be spaced apart from each other in the top-to-bottom direction.

The housing (not illustrated) forms a space in which various components described below are arranged, such that vacuum can be formed therein or gas such as argon (Ar) can be injected thereto. Furthermore, the housing can be opened/closed to put or take a work piece W into or out of the housing.

At this time, the cathode unit 110 may be disposed at the top, and the anode unit 120 may be disposed at the bottom.

The bidirectional voltage source supply unit 130 may apply a bidirectional voltage source to the cathode unit 110.

At this time, the bidirectional voltage source may indicate a current in which the polarity of a voltage alternates between a positive voltage and a negative voltage in accordance with time.

The bidirectional voltage source may have a frequency of 1 MHz or less.

The applying of the bidirectional voltage source can increase the charge accumulation time, thereby contributing to expanding a sheath region. Since the expansion of the sheath region can secure the time required for accelerating ions toward the work piece, the ions can hit the surface of the work piece W with higher energy. The bidirectional voltage source will be described in detail below.

The work piece W may be positioned close to the bottom surface of the cathode unit 110, facing the anode unit 120.

Therefore, since etching is performed on the bottom surface of the work piece W, atoms separated from the surface of the work piece W through the etching may fall toward the anode unit 120 due to the gravity, which makes it possible to prevent the atoms from being redeposited on the surface of the work piece W.

The positioning unit 140 serves to position the work piece W close to the bottom surface of the cathode unit 110.

The dry etching apparatus may further include a distance adjusting unit 150 for adjusting the distance between the cathode unit 110 and the anode unit 120.

In general, the amount of charge Q is proportional to an applied voltage V, a dielectric constant ε and the area A of the work piece, and inversely proportional to the distance d between the cathode unit and the anode unit (Q=VεA/d).

Thus, as the distance adjusting unit 150 adjusts the distance between the cathode unit 110 and the anode unit 120, the constant or optimal amount of charge can be maintained even when a variety of work pieces W with various areas A are etched.

The distance adjusting unit 150 may include a motor 152, a coupling 154 and a support rod 156. The support rod 156 may be formed of an insulating material to minimize the influence on plasma between the cathode unit 110 and the anode unit 120.

The motor 152 serves to generate a rotational force. In the present embodiment, the case in which a step motor capable of finely adjusting a rotational angle is applied as the motor 152 will be taken as an example for description. The step motor may be controlled by a separately installed control unit 190.

The coupling 154 may be rotated by the rotational force of the motor 152, and have a through-hole formed coaxially with the central axis of rotation along the central axis of rotation, and the through-hole may have a screw thread formed on the inner circumferential surface thereof. At this time, the central axis of rotation of the coupling 154 may be formed in the top-to-bottom direction.

The support rod 156 is extended in the top-to-bottom direction, and has a screw thread formed on the outer circumferential surface thereof and engaged with the inner circumferential surface of the coupling 154. The support rod 156 is inserted into the through-hole of the coupling 154 so as to be engaged with the inner circumferential surface of the through-hole, and supports the cathode unit 110 at the top thereof.

Therefore, when the motor 152 is rotated, the coupling 154 is also rotated. Thus, the support rod 156 is moved upward/downward to an extent corresponding to the rotational angle of the motor 152 and the pitch of the coupling 154. Accordingly, while the cathode unit 110 supported by the top of the support rod 156 is also moved upward/downward, the distance between the cathode unit 110 and the anode unit 120 may be adjusted.

At this time, the distance between the cathode unit 110 and the anode unit 120, which is adjusted by the distance adjusting unit 150, may range from 3 mm to 50 mm. Furthermore, in order to smoothly mount the work piece W on a jig and the cathode unit 110 according to the shape of the work piece W, the distance adjusting unit 150 may be spaced apart from the cathode unit 110 supported by the top of the support rod 156, and connected to a separate support (for example, a vacuum chamber or the like).

The positioning unit 140 serves to elastically support the work piece W such that the work piece W is positioned close to the bottom surface of the cathode unit 110, even though the cathode unit 110 is moved upward/downward.

The positioning unit 140 may include a first member 144, a second member 146 and a spring 148.

The first member 144 is inserted into a fixed piece 142 installed at the bottom of the anode unit 120 so as to move in the top-to-bottom direction, and extended upward.

At this time, the fixed piece 142 may be fixed to the housing (not illustrated).

The second member 146 may be formed at the top of the first member 144, and have a larger diameter than the first member 144. The top of the second member 146 may be disposed close to the cathode unit 110 while supporting the work piece W. At this time, the second member 146 may be formed of an insulating material to minimize the influence on plasma between the cathode unit 110 and the anode unit 120. The second member 146 may have various shapes such as a circular shape, rectangular shape, polygonal shape and cone shape, depending on the shape of the work piece W.

The spring 148 surrounds the outside of the first member 144, and elastically supports the second member 146 against the fixed piece 142 while the bottom thereof is supported by the fixed piece 142 and the top thereof is supported by the second member 146.

Therefore, since the work piece W supported by the second member 146 is elastically supported in the upward direction by the spring 148 at all times, the work piece W may be positioned close to the cathode unit 110 even though the cathode unit 110 is moved upward. At this time, the spring 148 may be formed of an insulating material to minimize the influence on plasma between the cathode unit 110 and the anode unit 120.

Figure 3:
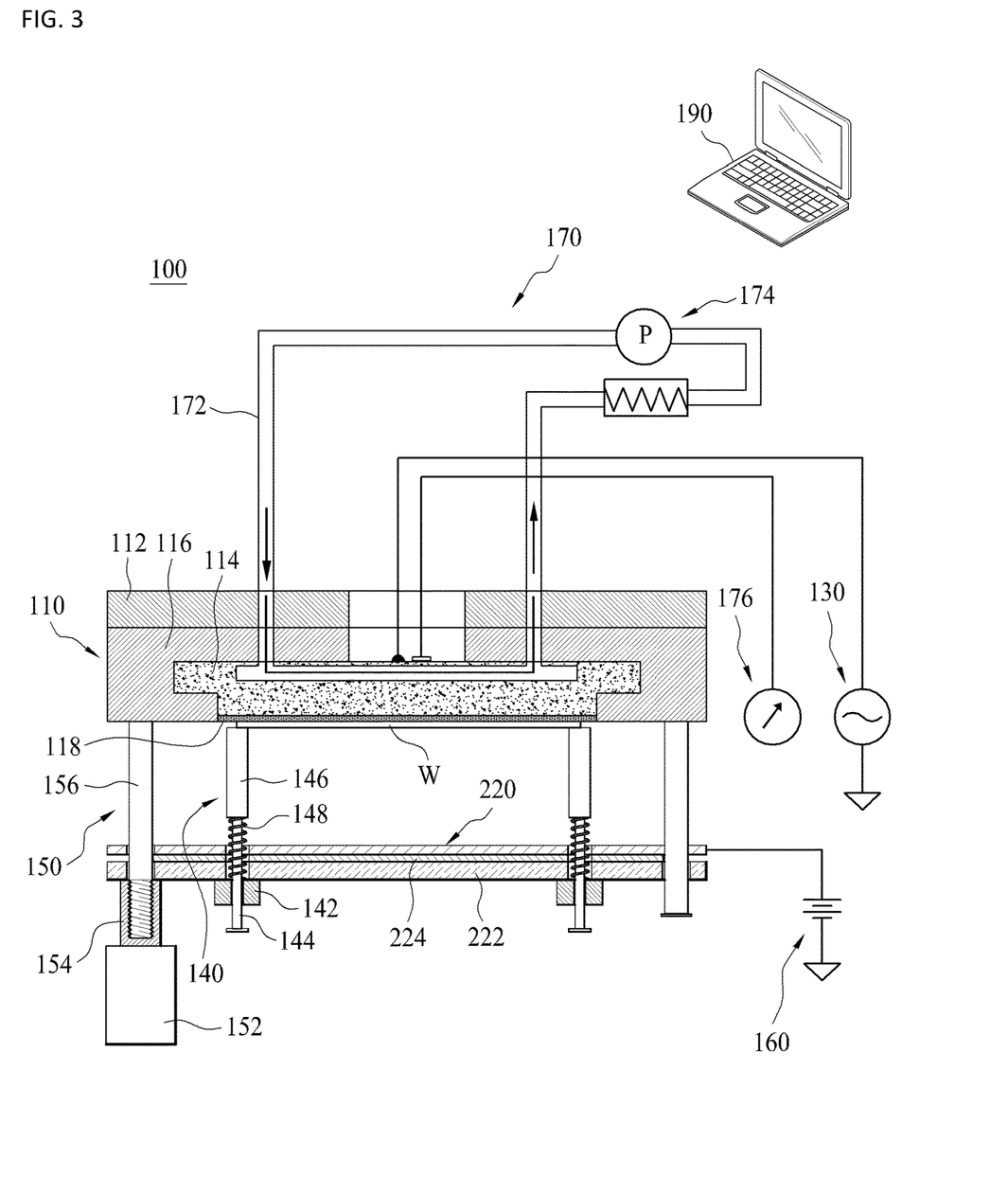
FIG. 3 is a cross-sectional view illustrating a dry etching apparatus according to another embodiment of the present invention.

As illustrated in FIG. 3, a base unit 222 for grounding may be formed at the bottom of the anode unit 120, the anode unit 120 may be installed over the base unit 222, and a second anode insulator 224 may be installed to achieve insulation between the base unit 222 and the anode unit 120.

Figure 4:
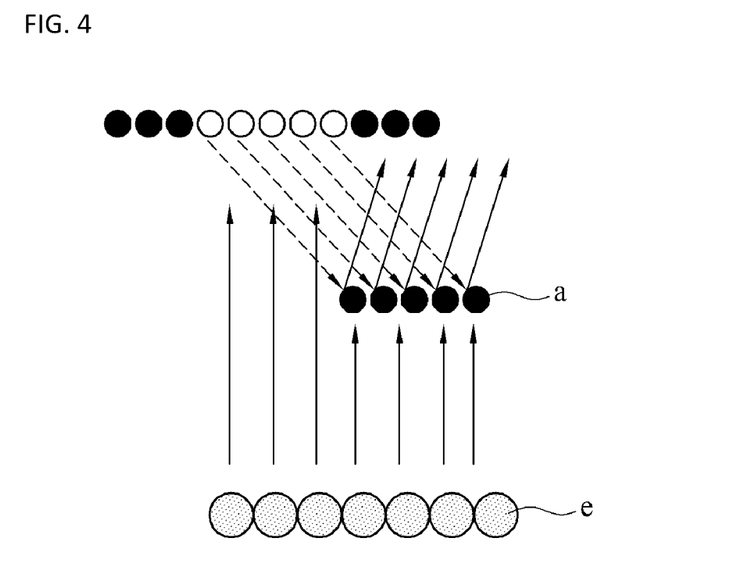
FIG. 4 illustrates that atoms a etched during a plasma etching process are rebounded by plasma ions or gas e and then redeposited.

As illustrated in FIG. 4, redeposition may occur as follows: some of atoms a separated from the surface of the work piece W through etching and falling toward the anode unit 120 hit plasma ions i or plasma gas facing the surface of the work piece W and move toward the surface of the work piece W so as to be redeposited on the surface of the work piece W.

In order to prevent the redeposition, the dry etching apparatus according to the present embodiment may further include a DC voltage source application unit 160 which applies a negative or positive DC voltage source to the anode unit 120 in order to decrease an ion hitting time required for the work piece while increasing an electron hitting time required for the work piece. In the present embodiment, the case in which the DC voltage source application unit 160 applies a negative DC voltage source will be taken as an example for description.

Before the operation of the DC voltage source application unit 160 is described, the waveform of the voltage supplied to the cathode unit 110 by the bidirectional voltage source supply unit will be described.

Figure 5:
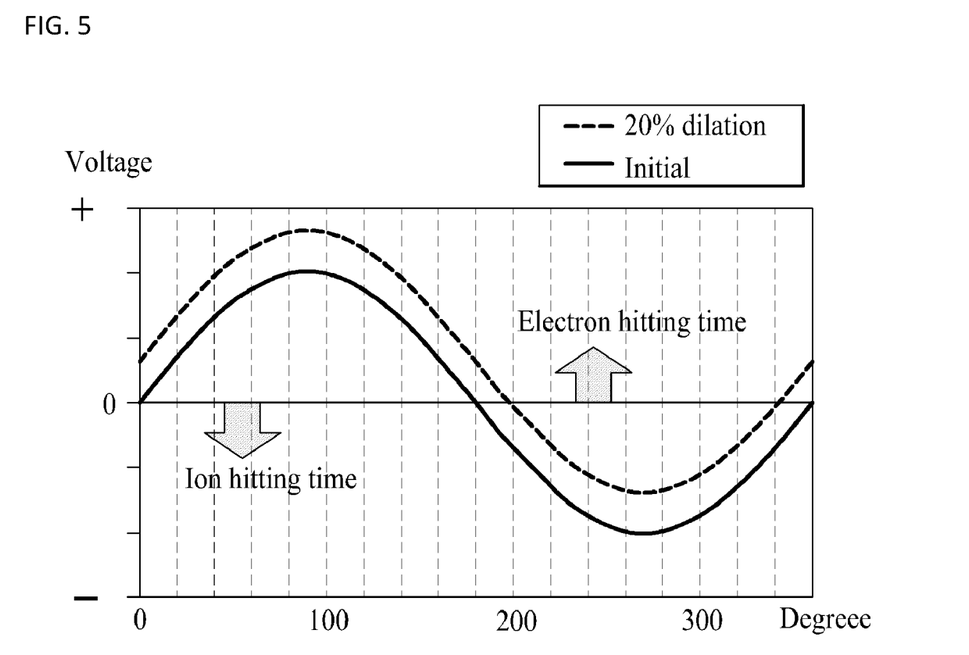
FIG. 5 is a graph illustrating that a bidirectional voltage source exhibits an AC waveform, showing a waveform change of a bidirectional voltage source formed between a cathode unit and an anode unit, when a DC voltage is applied to the anode unit.

As described above, the voltage supplied to the cathode unit may be referred to as a voltage of which the polarity alternates between + and − with time. The bidirectional voltage generated by the bidirectional voltage source supply unit 130 may exhibit a sine waveform corresponding to a general AC voltage waveform as illustrated in FIG. 5, or exhibit a trapezoidal bipolar waveform as illustrated in FIGS. 6 and 7.

That is, the bidirectional voltage source according to the present embodiment may indicate a voltage of which the polarity alternates between + and − with time, based on a point at which the voltage is 0, regardless of the shape and magnitude of the waveform.

Figure 6:
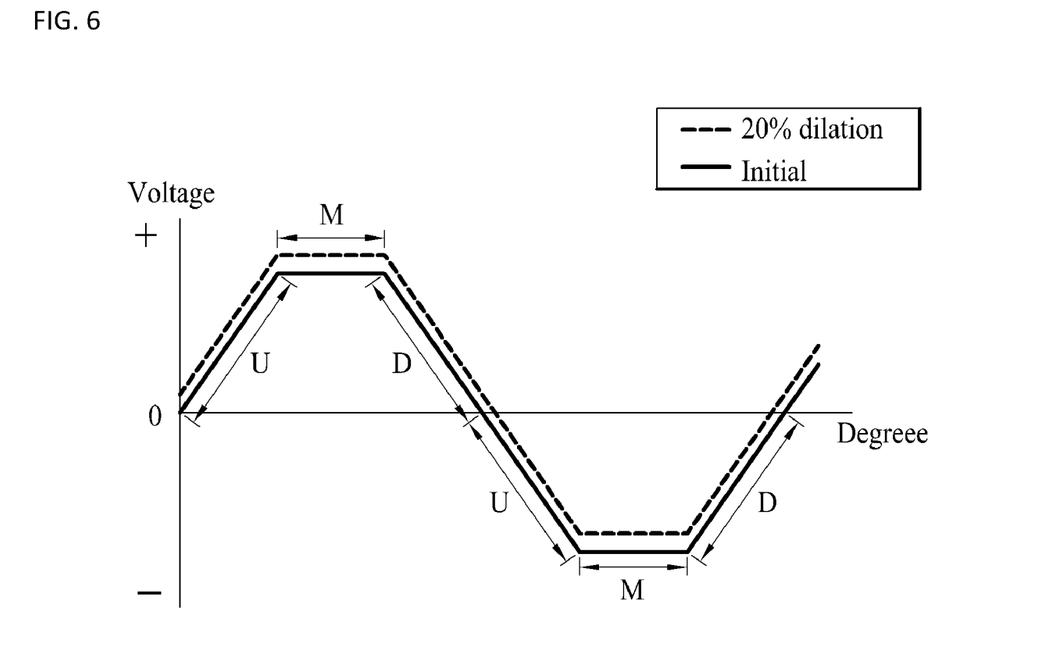
FIG. 6 is a graph illustrating that a bidirectional voltage source exhibits a symmetrical bipolar waveform, showing a waveform change of a bidirectional voltage source formed between the cathode unit and the anode unit, when a DC voltage is applied to the anode unit.
Figure 7:
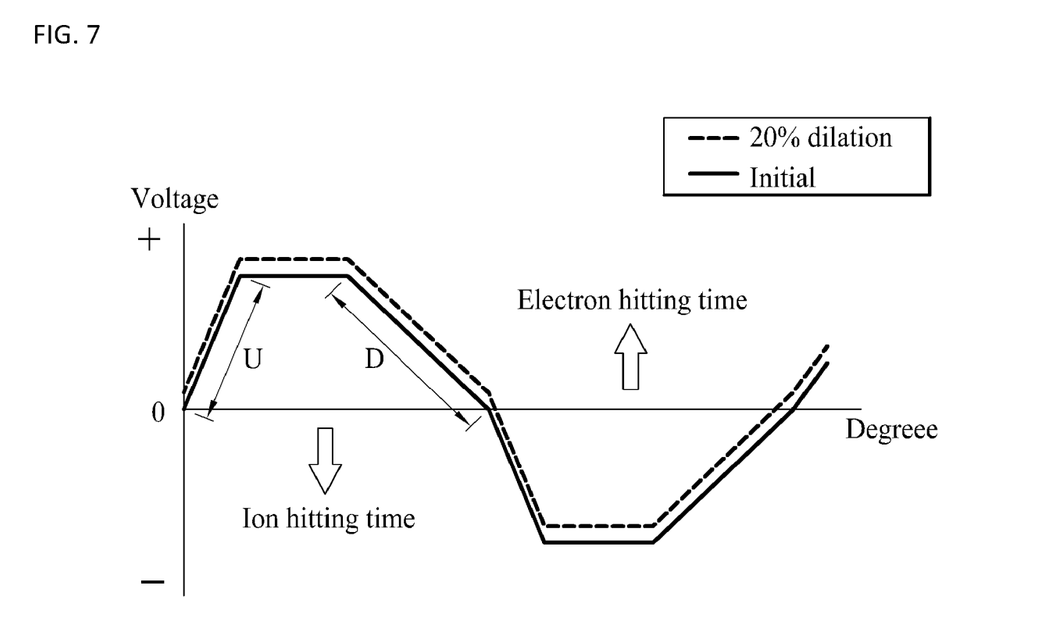
FIG. 7 is a graph illustrating that a bidirectional voltage source exhibits an asymmetrical bipolar waveform, showing a waveform change of a bidirectional voltage source formed between the cathode unit and the anode unit, when a DC voltage is applied to the anode unit.

When the bidirectional voltage exhibits a trapezoidal bipolar waveform as illustrated in FIGS. 6 and 7, the waveform of the voltage may include a rising section U and a falling section D.

In the waveform of the voltage, a section in which the waveform disperses negatively or positively is referred to as the rising section U, and a section in which the waveform converges to 0 is referred to as the falling section D.

Furthermore, a section in which the voltage is constantly maintained between the rising section U and the falling section D is referred to as a retention section M.

Depending on the waveform of the bidirectional voltage supplied by the bidirectional voltage source supply unit, the retention section M may appear or not.

The waveform of the bidirectional voltage source generated by the bidirectional voltage source supply unit 130 may be controlled by the control unit 190.

The control unit 190 may be implemented as a terminal or PC connected to the bidirectional voltage source supply unit 130. The present invention is not limited thereto, but the control unit 190 may be configured as a module including an input unit, a display unit, a calculation unit and a communication unit.

When the bidirectional voltage exhibits a trapezoidal bipolar waveform as illustrated in FIGS. 6 and 7, the slopes and lengths of the rising section U, the falling section D and the retention section M may be controlled by the control unit 190.

That is, the slopes of the rising section U and the falling section D may appear symmetrically with each other as illustrated in FIG. 6, or appear differently from each other as illustrated in FIG. 7. Although not illustrated in the drawings, the length of the retention section M may be adjusted, and the retention section M may be controlled to appear at a voltage of 0 in addition to the peak point of the waveform.

The retention section M may be controlled by the control unit 190, depending on the time and strength required for electrons to hit the work piece W and the time and strength required for ions to hit the work piece W.

Hereafter, the operation by the DC voltage source application unit 160 will be described.

FIG. 5 is a graph illustrating a waveform change of a bidirectional voltage formed between the cathode unit 110 and the anode unit 120, when the bidirectional voltage source generated by the bidirectional voltage source supply unit 130 exhibits a sign waveform as a general AC waveform, and a DC voltage is applied to the anode unit 120.

As described above, since the waveform of the AC bidirectional voltage generated by the bidirectional voltage source supply unit 130 is applied to the cathode unit 110, the bidirectional voltage source formed between the cathode unit 110 and the anode unit 120 may exhibit an AC waveform as illustrated in FIG. 5.

However, when a negative DC voltage is applied to the anode unit 120 by the DC voltage source application unit 160, the waveform of the AC bidirectional voltage source formed between the cathode unit 110 and the anode unit 120 moves upward as illustrated in FIG. 5. In the graph of FIG. 5, ions may hit the work piece W while the AC waveform falls below the voltage of 0, and electrons may hit the work piece W while the AC waveform rises over the voltage of 0.

Even when the bidirectional voltage source generated by the bidirectional voltage source supply unit 130 exhibits a trapezoidal bipolar waveform as illustrated in FIGS. 6 and 7, the bipolar waveform of the bidirectional voltage source formed between the cathode unit 110 and the anode unit 120 may move upward in the case where a negative DC voltage is applied to the anode unit 120 by the DC voltage source application unit 160. In the graph of FIG. 6, ions may hit the work piece W while the bipolar waveform of the bidirectional voltage source falls below the voltage of 0, and electrons may hit the work piece W while the bipolar waveform of the bidirectional voltage source rises over the voltage of 0.

FIGS. 5 to 7 illustrate that the waveform of the bidirectional voltage source is shifted by 20% from the original waveform.

Figure 8:
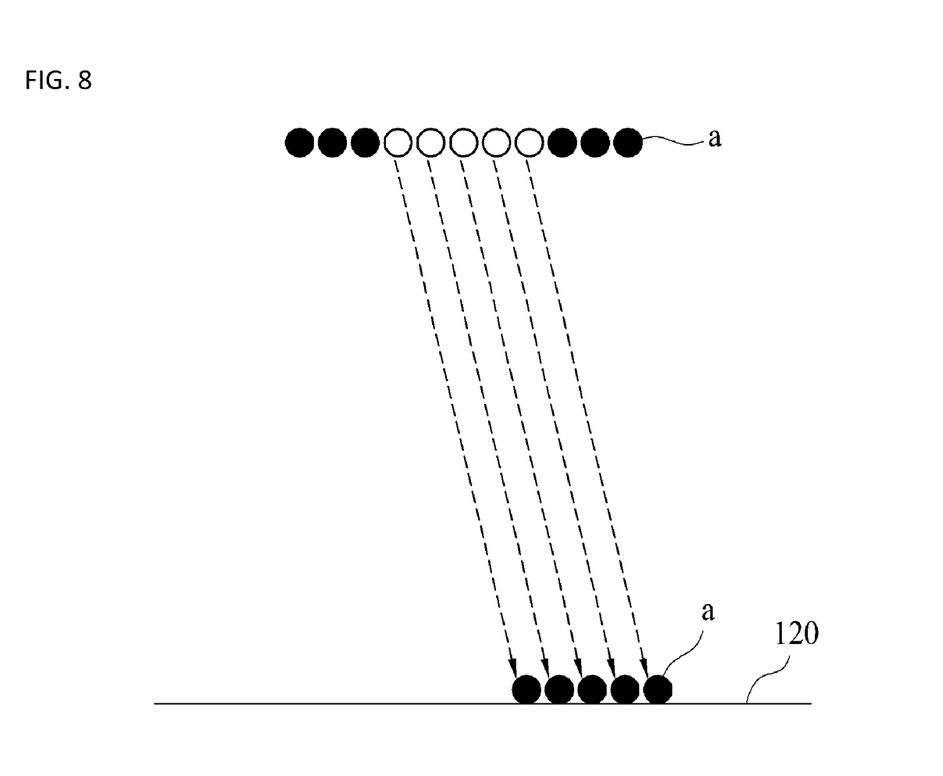
FIG. 8 illustrates that etched atoms a move when a DC voltage is applied to the anode unit.

Therefore, as illustrated in FIG. 8, a sufficient time may be secured until atoms a separated from the surface of the work piece W through etching and falling toward the anode unit 120 reach the anode unit 120, which makes it possible to prevent redeposition.

At this time, the DC voltage source applied to the anode unit 120 by the DC voltage source application unit 160 may range from 1% to 200% of the maximum voltage of the bidirectional voltage source applied to the cathode unit 110 by the bidirectional voltage source supply unit 130.

As illustrated in FIGS. 2 and 3, the cathode unit 110 may include a first conductor 112, a second conductor 114 and a cathode insulator 116.

The first conductor 112 may be disposed at the uppermost portion, and formed of a conductor such as a grounded metal.

The second conductor 114 may be disposed at the bottom of the first conductor 112 to receive a low-frequency AC voltage from the bidirectional voltage source supply unit 130, and formed of a conductive metal such as aluminum (Al).

The cathode insulator 116 may be disposed between the first and second conductors 112 and 114 and at the outer circumference of the second conductor 114, and insulate the second conductor 114 from the outside.

The cathode insulator 116 may be formed of any materials as long as they can serve as an insulator. However, a thin insulator 118 formed at the bottom surface of the cathode unit 110, positioned close to the work piece W, may include an oxide insulator such as aluminum oxide ($Al_2O_3$) or a nitride insulator such as aluminum nitride (AlN).

At this time, the insulator positioned close to the work piece may be bonded to the portion to which the bidirectional voltage source is applied, through an integrated coating technique or a bonding technique using a bonding material with an excellent heat transfer characteristic. Therefore, temperature control may be smoothly performed while generated heat is rapidly discharged to a cooling unit. The insulator 118 may contribute to increasing the capacity of the cathode unit 110. The insulator 118 may have a thickness of 3 mm or less, and the present embodiment is not limited by the thickness of the insulator 118.

Therefore, since the insulation is achieved to block a current from flowing to the work piece W positioned close to the cathode unit 110, it is possible to prevent an increase in temperature of the work piece W.

The etching apparatus may further include a temperature control unit 170 for controlling the temperature of the cathode unit 110.

The temperature control unit 170 serves to maintain the temperature of the work piece positioned close to the cathode unit 110 within a process temperature range by controlling the temperature of the cathode unit 110.

At this time, the process temperature range may indicate a temperature range which is maintained during a work process, in order to obtain a positive work result depending on the material of a work piece, the type of a work and the like.

That is, the temperature at which a work is smoothly performed during a process can be maintained to obtain the best work result of the work piece.

The temperature control unit 170 may include a cooling channel 172, a refrigerant circulating unit 174 and a temperature measurement unit 176.

The cooling channel 172 may be formed in the second conductor 114, and have the shape of a pipe through which cooling water flows. In the present embodiment, the cooling channel 172 may be extended downward from the surface of the first conductor 112 into the second conductor 114, and horizontally extended in the second conductor 114 so as to cool down the first and second conductors 112 and 114.

The refrigerant circulating unit 174 may be installed in the cooling channel 172 so as to circulate cooling water therethrough.

The temperature measurement unit 176 may serve to measure the temperature of the second conductor 114.

When the temperature rises, the separately installed control unit 190 may drive and control the refrigerant circulating unit 174 to increase the amount of circulated cooling water, such that the temperature measured by the temperature measurement unit 176 does not exceed the upper limit of the preset temperature range.

Alternatively, the control unit 190 may control the refrigerant circulating unit 174 to control the amount of circulated cooling water, such that the temperature measured by the temperature measurement unit 176 does not exceed the lower limit of the temperature range.

Therefore, the temperature control unit 170 can also control the temperature of the work piece positioned close to the cathode unit 110 while controlling the temperature of the cathode unit 110.

Hereafter, a control method for controlling the above-described dry etching apparatus will be described.

Figure 9:
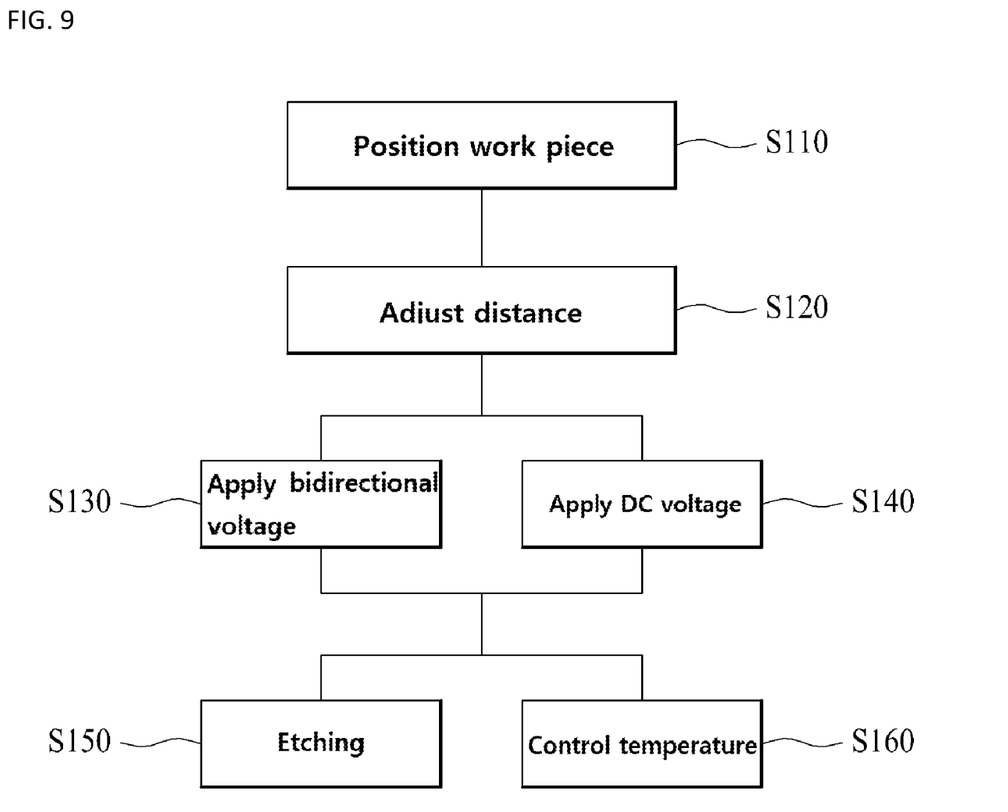
FIG. 9 is a flowchart illustrating a control method of the dry etching apparatus according to the embodiment of the present invention.

As illustrated in FIG. 9, the control method of the dry etching apparatus according to the present embodiment may include a work piece positioning step S110, a distance adjusting step S120, a bidirectional voltage source applying step S130, a DC voltage applying step S140, an etching step S150 and a temperature control step S160.

The work piece positioning step S110 is to position the work piece W close to the bottom surface of the cathode unit 110 in the housing of the dry etching apparatus. At this time, the work piece W may be positioned in such a manner that a surface of the work piece W, which needs to be etched, faces the anode unit 120 positioned at the bottom.

Therefore, while etching is performed on the bottom surface of the work piece W, atoms a separated from the surface of the work piece W through the etching may fall onto the anode unit 120 due to the gravity, which makes it possible to prevent the atoms from being redeposited on the surface of the work piece W.

At this time, the work piece W may be interposed and fixed between the positioning unit 140 and the cathode unit 110.

The distance adjusting step S120 is to adjust the distance between the cathode unit 110 and the anode unit 120 such that a plasma etching operation is performed with the optimal charge amount.

At the present step, the support rod 156 may be moved upward/downward by rotating the motor 152 through the separately installed control unit 190. Thus, while the cathode unit 110 is moved upward/downward, the distance from the anode unit 120 may be adjusted.

At this time, the distance between the cathode unit 110 and the anode unit 120 may range from 3 mm to 50 mm.

Therefore, even when an etching operation is performed on work pieces W having various shapes and areas, the distance between the cathode unit 110 and the anode unit 120 can be adjusted to the optimal distance. Thus, the etching operation can be performed with the optimal charge amount.

The bidirectional voltage source applying step S130 is to apply the bidirectional voltage source to the cathode unit 110.

At this time, the frequency of the bidirectional voltage source applied to the cathode unit 110 may be lower than 1 MHz.

The applying of the bidirectional voltage source in a relatively low frequency band can increase the charge accumulation time, thereby contributing to expanding the sheath region. Furthermore, since the time required for accelerating ions toward the work piece W can be secured, plasma ions with higher energy may hit the surface of the work piece W.

When the bidirectional voltage source is applied, the housing may be filled with gas such as argon (Ar).

The DC voltage applying step S140 may be performed at the same time as the bidirectional voltage source applying step S130, and is to apply a DC voltage to the anode unit 120. At this time, a negative or positive DC voltage may be applied to the anode unit 120. In the present embodiment, a negative DC voltage may be applied. However, the present invention is not limited thereto.

As the DC voltage is applied to the anode unit 120, the waveform of the bidirectional voltage source formed between the cathode unit 110 and the anode unit 120 may move in the positive direction as a whole, as illustrated in FIGS. 5 to 7. Thus, the ion hitting time required for the work piece W may be increased, and the electron hitting time required for the work piece W may be decreased. Therefore, as illustrated in FIG. 6, a sufficient time may be secured until atoms a separated from the surface of the work piece W through etching and falling toward the anode unit 120 reach the anode unit 120, which makes it possible to prevent redeposition.

At this time, the DC voltage applied to the anode unit 120 by the DC voltage source application unit 160 may range from 1% to 200% of the maximum voltage of the AC voltage applied to the cathode unit 110 by the bidirectional voltage source supply unit 130.

While the bidirectional voltage source applying step S130 and the DC voltage applying step S140 are performed, the etching step S150 may be performed to etch the surface of the work piece W.

During the etching step S150, the temperature control step S160 may be further performed. At the temperature control step S160, when the temperature rises, the separately installed control unit 190 may drive and control the refrigerant circulating unit 174 to increase the amount of circulated cooling water, such that the temperature measured by the temperature measurement unit 176 does not exceed the preset temperature range.

Therefore, the temperature control unit 170 can also cool down the work piece W positioned close to the cathode unit 110 while cooling down the temperature of the cathode unit 110. The temperature control unit 170 may also control the cooling speed of the work piece W, and control the temperature of the work piece W so as not to exceed the lower limit of the preset temperature range.

Figure 10:
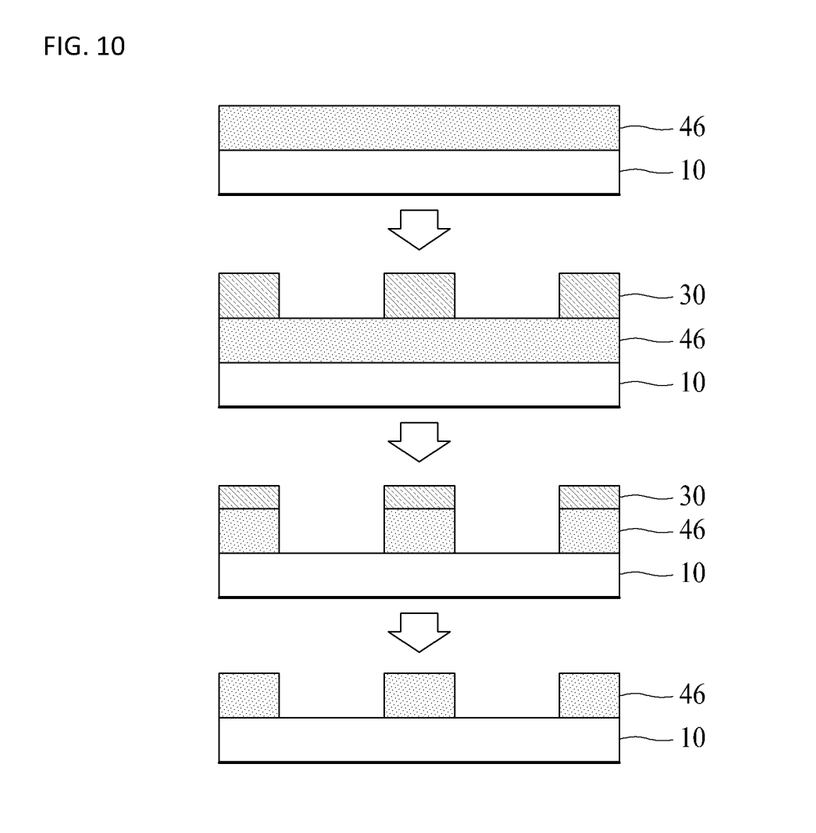
FIG. 10 illustrates a process of etching a Cu layer on a semiconductor through the dry etching apparatus and the control method thereof according to the embodiment of the present invention.

FIG. 10 illustrates a process of etching Cu on a semiconductor through the dry etching apparatus and the control method thereof according to the embodiments of the present invention.

As illustrated in FIG. 10, a PR layer 30 is formed on a work piece W having a Cu layer 46 deposited uniformly on silicon 10 through a lithography process. Then, when etching is performed through the dry etching apparatus 100 according to the present embodiment, the Cu layer 46 excluding the portion coated with the PR layer 30 through the lithography process may be all etched. Then, the process may be completed by removing the PR layer 30.

In this way, the number of steps in the etching process according to the present embodiment can be significantly reduced in comparison to the conventional dry etching process.

Figure 11:
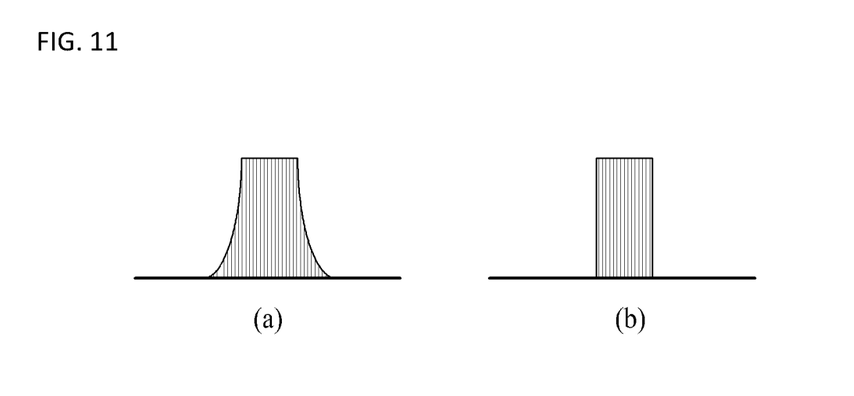
FIGS. 11A and 11B illustrate a portion etched through the conventional wet etching method and a portion etched through the dry etching apparatus and the control method thereof according to the embodiment of the present invention.

FIGS. 11A and 11B comparatively illustrate a cross-section of a portion etched through the conventional wet etching method and a cross-section of a portion etched through the dry etching apparatus and the control method thereof according to the embodiments of the present invention.

As illustrated in FIG. 11A, the conventional wet etching method has an isotropic characteristic in which etching is performed uniformly in every direction. Therefore, a portion under the PR layer is laterally etched to an extent corresponding to the thickness of the PR layer. The etched portion has the shape of a parabola in which the cross-section thereof has a thick bottom and is gradually narrowed upward. As illustrated in FIG. 11B, however, the dry etching apparatus and the control method thereof according to the embodiments of the present invention have an anisotropic characteristic. Therefore, the cross-section of the etched portion can have a clean profile in which the bottom and top thereof have the same width.

While various embodiments have been described above, it will be understood to those skilled in the art that the embodiments described are by way of example only. Accordingly, the disclosure described herein should not be limited based on the described embodiments.

The invention claimed is:

1. A dry etching apparatus comprising:
   an anode;
   a cathode configured to receive a bidirectional voltage source of which the voltage polarity alternates between a positive voltage and a negative voltage with time, and spaced apart from the anode;
   a positioner moveably attached to the anode to position a work piece at a surface of the cathode, wherein a working face of the work piece faces the anode;
   a bidirectional voltage source supply configured to apply the bidirectional voltage source to the cathode; a controller connected to the bidirectional voltage source supply and comprising a computer configured to calculate and to control the waveform of the bidirectional voltage source;
   a distance adjuster coupled between the anode and the cathode to adjust the distance between the cathode and the anode; and
   a DC voltage source applicator configured to apply a DC voltage source to the anode, wherein the bidirectional voltage source comprises a rising section in which the waveform of the voltage disperses negatively or positively, a falling section in which the waveform of the voltage converges to o, and a retention section in which the voltage is constantly retained between the rising section and the falling section, and the slopes of the rising section and the falling section exhibit a bipolar waveform in which the slopes are constantly maintained, wherein the slopes and lengths of the rising section, the falling section and the retention section are controlled by the controller and a sufficient time is secured until atoms separated from the work piece through etching and falling due to gravity toward the anode reach the anode to prevent redeposition,
   wherein as the DC voltage source is applied to the anode, the waveform of the bidirectional voltage source formed between the cathode and the anode is caused to shift by 20% from an original waveform in a positive direction as a whole thereby decreasing an ion hitting time required for the work piece while increasing an electron hitting time required for the work piece,
   wherein the positioner is elastically connected to the anode to support the work piece to be positioned close to the surface of the cathode, facing the anode, and wherein the cathode is installed at the top of the apparatus and the anode is positioned at the bottom of the apparatus.

2. The dry etching apparatus of claim 1, wherein the distance adjuster comprises:
   a motor configured to provide a rotational force;
   a coupling rotated by the rotational force of the motor, and having a through-hole formed along the central axis of rotation, the through-hole having a screw thread formed on the inner circumferential surface thereof; and a support rod inserted into the through-hole of the coupling so as to be engaged with the inner circumferential surface of the through-hole, and extended upward to support the cathode, wherein while the coupling is rotated by the rotational force of the motor, the support rod and the cathode supported by the support rod are moved upward/downward to adjust the distance between the cathode and the anode.

3. The dry etching apparatus of claim 1, wherein the positioner comprises:

a first member inserted into a fixed piece installed at the bottom of the anode so as to move in the top-to-bottom direction, and extended upward;

a second member formed at the top of the first member, having a larger diameter than the first member, and configured to position the work piece close to the cathode; and a spring positioned around the first member, and elastically supporting the second member against the fixed piece while the bottom thereof is supported by the fixed piece and the top thereof supports the second member.

4. The dry etching apparatus of claim 1, wherein a negative voltage or positive voltage of the DC voltage source is applied to the anode.

5. The dry etching apparatus of claim 1, wherein a low-frequency AC voltage applied to the cathode has a frequency lower than 1 MHz.

6. The dry etching apparatus of claim 1, wherein the DC voltage source applied to the anode by the DC voltage source applicator ranges from 1% to 200% of the maximum voltage of the bidirectional voltage source applied to the cathode by the bidirectional voltage source supply.

7. The dry etching apparatus of claim 1, wherein the distance between the cathode and the anode, which is adjusted by the distance adjuster, ranges from 3 mm to 50 mm.

8. The dry etching apparatus of claim 1, further comprising:

a base formed at the bottom of the anode so as to be grounded; and a second anode insulator installed between the base and the anode.

9. The dry etching apparatus of claim 1, wherein a surface of a second conductor of the cathode, facing the work piece, is insulated to block a current from being applied to the work piece.

10. The dry etching apparatus of claim 1, wherein the cathode comprises:

a first conductor disposed at the uppermost portion so as to be grounded;

a second conductor disposed at the bottom of the first conductor, and configured to receive the bidirectional voltage source from the bidirectional voltage source supply; and a cathode insulator disposed between the first and second conductors and at the circumference of the second conductor.

11. The dry etching apparatus of claim 10, wherein the second conductor formed on a surface of the cathode insulator and positioned close to the work piece, and the cathode insulator are formed of a material including aluminum oxide ($Al_2O_3$) or aluminum nitride (AlN).

12. The dry etching apparatus of claim 10, further comprising a temperature controller in communication with the cathode to remove heat or to supply heat to cool or heat the cathode such that the temperature of the work piece is controlled within a process temperature range.

13. The dry etching apparatus of claim 12, wherein the temperature controller comprises:

a cooling channel formed in the second conductor, such that cooling water flows there through; and a refrigerant circulator configured to circulate the cooling water through the cooling channel.

14. The dry etching apparatus of claim 13, wherein the temperature controller further comprises a temperature measurer configured to measure the temperature of the second conductor.

* * * * *